United States Patent
Shah et al.

(10) Patent No.: US 11,942,970 B2
(45) Date of Patent: Mar. 26, 2024

(54) COMPRESSION CIRCUITS AND METHODS USING TREE BASED ENCODING OF BIT MASKS

(71) Applicant: Microsoft Technology Licensing, LLC, Redmond, WA (US)

(72) Inventors: Nishit Shah, Sunnyvale, CA (US); Ankit More, San Mateo, CA (US); Mattheus C. Heddes, Richmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/687,589

(22) Filed: Mar. 4, 2022

(65) Prior Publication Data

US 2023/0283296 A1    Sep. 7, 2023

(51) Int. Cl.
*H03M 7/40* (2006.01)
(52) U.S. Cl.
CPC .................................. *H03M 7/4093* (2013.01)
(58) Field of Classification Search
CPC .............................. H03M 7/40; H03M 7/4093
See application file for complete search history.

(56) References Cited

U.S. PATENT DOCUMENTS

| | | | | | |
|---|---|---|---|---|---|
| 5,990,812 | A * | 11/1999 | Bakhmutsky | ......... | H03M 7/425 341/67 |
| 7,747,599 | B1 * | 6/2010 | Depelteau | ........... | G06F 16/2246 707/706 |
| 9,588,590 | B2 * | 3/2017 | Zotov | .................... | G06F 3/0418 |
| 9,780,640 | B2 * | 10/2017 | Nguyen | .................... | H02M 1/32 |
| 10,169,433 | B2 * | 1/2019 | Lerios | .................... | G06F 16/254 |
| 10,176,236 | B2 * | 1/2019 | Nguyen | ............ | G06F 16/24549 |
| 10,333,547 | B2 * | 6/2019 | Kalevo | ................ | H04N 19/119 |
| 2003/0135530 | A1 * | 7/2003 | Parthasarathy | ......... | G06F 7/724 708/492 |
| 2006/0206557 | A1 | 9/2006 | Wong et al. | | |
| 2011/0055174 | A1 * | 3/2011 | Popovski | ................ | G06F 16/22 707/693 |
| 2012/0131117 | A1 * | 5/2012 | Leshchiner | ............. | H04L 69/04 709/206 |

(Continued)

OTHER PUBLICATIONS

"International Search Report and Written Opinion issued in PCT Application No. PCT/US22/051297", dated Mar. 29, 2023, 11 Pages.

*Primary Examiner* — Lam T Mai
(74) *Attorney, Agent, or Firm* — Fountainhead Law Group PC (57) ABSTRACT

Embodiments of the present disclosure include techniques for compressing data using a tree encoded bit mask that may result in higher compression ratios. In one embodiment, an input vector having a plurality of values is received by a first plurality of switch circuits. Selection of the input values is controlled by sets of bits from the bit mask. The sets of bits specify locations of portions of the input vector where particular value of interest reside. The switch circuits output multiple values of the input vector, which include the particular value of interest. A second stage of switch circuits is controlled by logic circuit that detects values on the outputs of the first stage of switch circuits and outputs the values of interest. In some embodiments, the values of interest may be non-zero values of a sparse input vector, and the switch circuits may be multiplexers.

20 Claims, 4 Drawing Sheets

(56) References Cited

U.S. PATENT DOCUMENTS

| | | | |
|---|---|---|---|
| 2015/0043270 A1* | 2/2015 | Singh | G11C 11/416 |
| | | | 365/154 |
| 2016/0196349 A1* | 7/2016 | Berkhin | G06F 16/29 |
| | | | 707/706 |
| 2017/0214928 A1* | 7/2017 | Cook | H04N 19/182 |
| 2017/0293659 A1 | 10/2017 | Huang | |
| 2017/0315814 A1* | 11/2017 | Smith | G06F 9/3855 |
| 2017/0371660 A1* | 12/2017 | Smith | G06F 9/30043 |
| 2019/0057539 A1* | 2/2019 | Stanard | G06T 17/005 |
| 2019/0319797 A1* | 10/2019 | Suresh | H04L 9/0869 |
| 2021/0240684 A1 | 8/2021 | Xiao et al. | |

\* cited by examiner

COMPRESSION CIRCUITS AND METHODS USING TREE BASED ENCODING OF BIT MASKS

BACKGROUND

The present disclosure relates generally to data compression, and in particular to compression circuits and methods using tree based encoding of bit masks.

Many modern digital systems and applications are required to process large volumes of digital values. For example, artificial intelligence applications may be required to store (e.g., in memory) and process (e.g., perform mathematical operations) huge arrays of digital values representing activations or weights. In these and other applications, it is desirable to compress such data at various points during processing to reduce the loading on system resources. Accordingly, data may be compressed and decompressed as it is processed by the system, for example.

Embodiments described herein advantageously compressed data using a tree based encoding of bit masks.

DETAILED DESCRIPTION

Described herein are techniques for compressing data using bit masks. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

Features and advantages of the present disclosure include techniques for compressing data using a tree based encoded bit mask. For example, an input vector may comprise a plurality of values, which may be represented by a plurality of digital bits using a variety of different formats (e.g., 4 bit float, 8 bit integer, 8 bit float, etc. . . . ). A set of bits may be used specify the location of particular values within the input vector (e.g., non-zero values). Sets of bits that specify the location of values of interest in the input vector are referred to herein as a bit mask. The input vector may be received on inputs of switch circuits, and a set of bits specifying the location of a particular value of interest may be used to select multiple values from all the values of the input vector. The multiple values include the particular value of interest. A logic circuit may be used to detect the particular value of interest from the multiple values at the output of each switch circuit and control selection of the particular values of interest using second switch circuits. The set of bits used to select values from the input vector may advantageously use a tree encoding, thus reducing the number of bits in the bit mask needed to specify the location of values of interest in an input vector. In one embodiment, multiplexers are used as switch circuits.

Figure 1A:
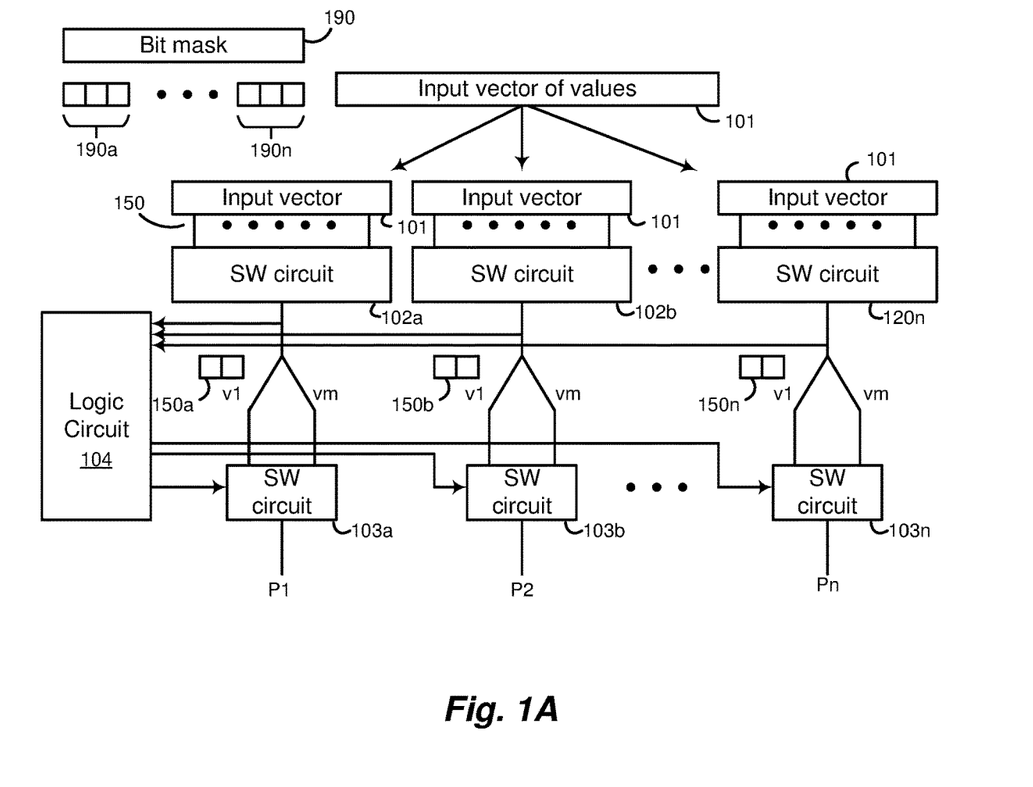
FIG. 1A illustrates a circuit for compressing data according to an embodiment.

FIG. 1A illustrates a circuit for compressing data according to an embodiment. It may be desirable to compress an input vector 101 comprising a plurality of values (e.g., represented as digital bits) such that only particular values of interest remain (e.g., P1-Pn). Here, the values of input vector 101 are coupled to inputs of first switch circuits 102a-102n. Switch circuits 102a-102n may further include control inputs coupled to sets of bits from a bit mask 190. As used herein, switch circuits are electronic circuits comprising a plurality of transistors configured to selectively couple values on one or more inputs to one or more outputs. A variety of transistor circuit configurations may be used for switch circuits. One common switch circuit is a multiplexer, for example.

Features and advantages of the present disclosure include the use of sets of bits (aka bit mask sets) 190a-190n that specify locations of particular values in the input vector 101. A bit mask set may specify the location of a particular value using a tree encoding, for example. For example, each bit in a bit mask set may indicate a portion of the input vector where the value of interest is located (e.g., upper half bits of the vector, then lower half, and then upper half, etc. . . . ) similar to a binary search.

The bits of the bit mask selectively couple multiple values from the input vector on a switch circuit input to a corresponding output of the switch circuit. For instance, multiple values from the input vector may be coupled to each input (e.g., input 150) of switch circuits 102a-102n. One set of bit mask bits (e.g., bits 190a) may be used to select one of the inputs of switch circuit 102a and couple the selected input to the output of switch circuit 102a. As illustrated further below, the set of bits coupled to each switch circuit 102a-102n may select inputs using a tree encoding. The outputs of the switch circuits 102a-102n produce the multiple values 150a-150n on the selected input.

Second switch circuits 103a-103n have inputs coupled to the multiple values 150a-150n on the outputs of the first switch circuits 102a-102n. A logic circuit 104 includes inputs coupled to the outputs of the first switch circuits 102a-102n. Outputs of logic circuit 104 are coupled to select inputs of second switch circuits 103a-103n. The multiple values on the outputs of the switch circuits 102a-102n may be coupled to different inputs of the switch circuits 103a-103n. Logic circuit 104 may detect particular values (e.g., zero and non-zero values) of the multiple values on outputs of the first switch circuits 102a-102n and configure the second switch circuits 103a-103n to output one of the particular values. For example, logic circuit 104 may detect a non-zero value in one of the multiple values 150a on the output of switch circuit 102a and configure switch circuit 103a to select the corresponding input and couple the non-zero value to the output, P1.

Figure 1B:
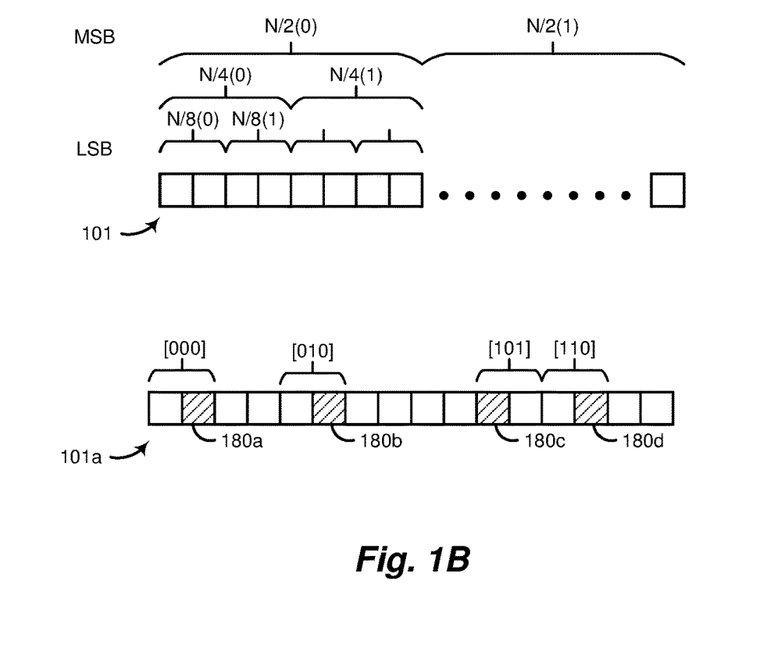
FIG. 1B illustrates bit mask encoding according to an embodiment.

FIG. 1B illustrates bit mask encoding according to an embodiment. As illustrated here, locations in the input vector 101 may be specified using a set of bits. For example, an MSB may be used to determine if the value is located above or below a midpoint. Here, a value in an N value vector may be above (1) or below (0) the N/2 point, above (1) or below (0) the N/4 point, above (1) or below (0) the N/8 point, etc. . . . . In various embodiments, locations of different sets of multiple values may be specified for N values in an input vector using the encoded in FIG. 1B.

Example values of interest are illustrated in vector 101*a*. In this example, input vector has N=16 values and there are 4 particular values of interest 180*a-d* that are to be retained in the compressed output. In this example, a set of 3 bits is used for each value. The location of value 180*a* is specified as one of a pair of values by bits 000. The location of value 180*a* is specified as one of a pair of values by bits [000]. The location of value 180*b* is specified as one of a pair of values by bits [010]. The location of value 180*c* is specified as one of a pair of values by bits.

Finally, the location of value 180*d* is specified as one of a pair of values by bits [110]. The sets of bits may be combined into a bit mask specifying locations of values 180*a-d* in vector 101*a*, and the input vector may be associated with the bit mask and/or compressed values when processing the data. The final values from the specified multiple values (here, pairs of values) are selected by the second switch circuits and logic circuit described above, thus reducing the number of bits required in a bit mask and reducing the data overhead associated with processing the data.

From the above description it can be seen that in some cases particular values of interest may be in the same group multiple values specified by two different sets of bit masks. For example, both of the values at [110] may be values of interest to be produced as a compressed output. In these cases, logic circuit 104 may compare bits coupled to the control inputs of the first switch circuits 102*a*-102*n* to determine if the same bit mask set is used to specify two different values in the input vector. Logic circuit 104 may configure one switch circuit of the second switch circuits 103*a*-103*n* (e.g., switch circuit 103*a*) to output a first particular value (e.g., v1) from a first set of multiple values (e.g., 150*a*) and configure a second switch circuit (e.g., switch circuit 103*b*) of the second switch circuits to output a second particular value (e.g., v2) from the first set of multiple values (e.g., 150b), where the multiple values from switch circuits 102*a* and 102*b* may hold the same values because the bit mask sets are the same, for example.

Figure 2:
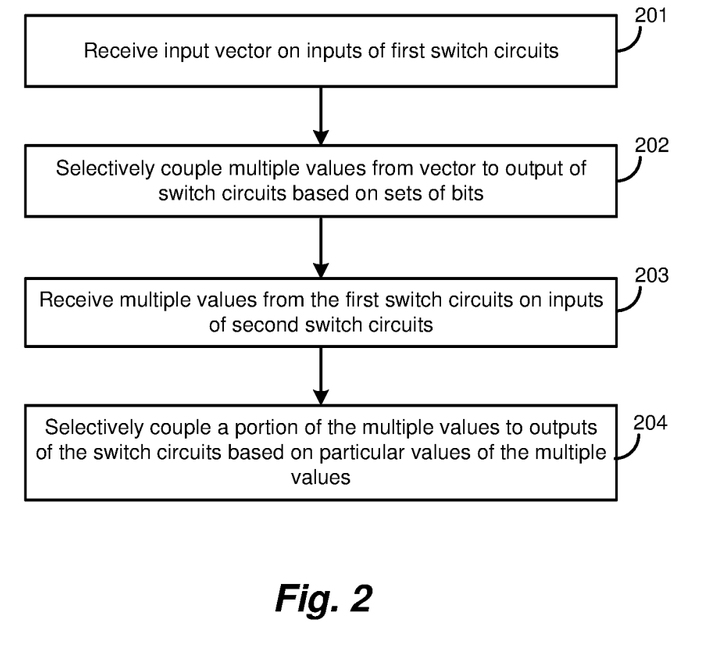
FIG. 2 illustrates a method of compressing data according to an embodiment.

FIG. 2 illustrates a method of compressing data according to an embodiment. At 201, an input vector comprising a plurality of values is received on a plurality of inputs of a first plurality of switch circuits. The plurality of values may include zero values and non-zero values. In other embodiments, the values (e.g., an absolute value) may be selected based on being above or below a threshold, for example. The switching circuits may be multiplexers (MUXs), for example. At 202, multiple values of the values on the inputs of the first switch circuits are selectively coupled, based on a plurality of sets of bits, to corresponding outputs of the first switch circuits. For example, for values having a length of 4 bits, 2 values (total of 8 bits) may be coupled to each input of a MUX, and multiple MUXs may receive the input vector and a set of mask bits to select multiple values (8bits) including each of the particular values of interest. At 203, the multiple values from the outputs of the first switch circuits are received on a plurality of inputs of second switch circuits. At 204, a portion of the multiple values (e.g., the particular value of interest and another adjacent value) are selectively coupled to outputs of the second switch circuits. Selectively coupling is based on particular values of the multiple values. For example, the output values from each of the first stage of MUXs may be coupled to a logic circuit which detects the particular values of interest and outputs select signals to second stage MUXs.

Figure 3:
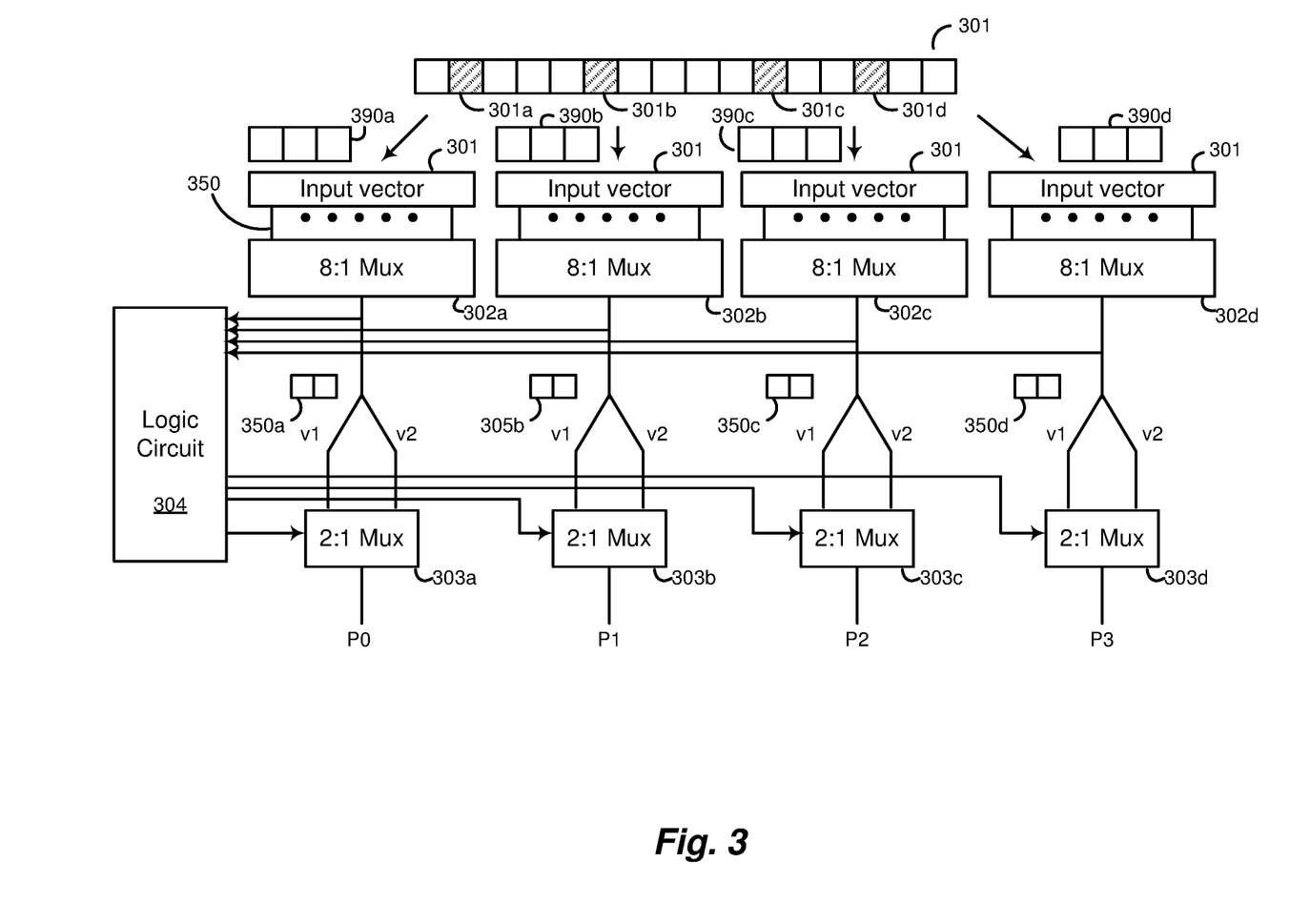
FIG. 3 illustrates an example circuit for compressing data using a tree based encoding of bit masks according to an embodiment.

FIG. 3 illustrates an example circuit for compressing data using a tree based encoding of bit masks according to an embodiment. In various embodiments, the input vector may comprise two (2) to a power of N values ($2^N$) and the bit mask may comprise a plurality of (N-1) length sets of bits, where N is an integer. The present example illustrates compressing a N=4, 16 value sparse vector 301 with 4 non-zero (NZ) values 301*a-d* and the other values all zeros (e.g., 75% compression by removal of all zero values). In this example, the values are 4 bits each (e.g., 4 bit floating point with separate exponent and sign bits). Vector 301 is applied to the inputs of 4 MUXs 302*a-d*. Each MUX 302*a-d* receives all 16 values. The inputs (e.g., input 350) of each MUX are 8-bit inputs, and MUXs 302*a-d* are 8:1 MUXs. Thus, each input receives 2 values of the input vector 301. Each MUX 302*a-d* receives a set of bits for specifying the location (or position) of the group of values (multiple values) that include a particular value of interest in the input vector 301. In this example, each MUX receives a set of 3-bits. Accordingly, bit mask set 390*a* specifies the location of a pair of values including value 301*a*, bit mask set 390*b* specifies the location of another pair of values including value 301*b*, bit mask set 390*c* specifies the location of yet another pair of values including value 301*c*, and bit mask set 390*d* specifies the location of a pair of values including value 301*d*. Accordingly, the output of MUXs 302*a-d* are pairs of values 350*a-d* each including one or more of the particular values of interest 301*a-d*.

The outputs of MUXs 302*a-d* are coupled to logic circuit 304. Logic circuit 304 detects the values in the pairs of values 350*a-d* and generates a select control signal for second stage 2:1 MUXs 303*a-d*. The pair of values at the output of each MUX 302*a-d* may be separately coupled to inputs of 2:1 MUXs 303*a-d*, and select inputs to each MUX couple a particular value of interest, such as 301*a-d*, to produce a compressed output P1, P2, P3, P4.

In some instances, the values of interest may be spread out across an input vector, and each of the outputs of MUXs 302*a-d* includes only 1 value of interest. However, in some cases multiple values of interest may be located next to each other in the input vector. Accordingly, in some cases, two values of interest may have the same bit mask sets (e.g., 2 values of interest are in the $1^{st}$ and $2^{nd}$ positions or $3^{rd}$ positions and $4^{th}$ positions). In this case, the outputs of multiple MUXs may be the same, with both pairs of values 350*a*, 350*b*, 350*c*, or 350*d* being values of interest (e.g., 301*a-b* or 301*b-c*, etc. . . . ). Therefore, the logic circuit may further include logic gates to detect this condition and selectively couple the proper value to the output. The following is example logic that may be implemented in logic circuit 304 to select a value of interest, include cases where two sets of bit masks are the same:

$MUX303a$:if($m$)then$P0=m$,else$P0=n$;

$MUX303b$:if($x$OR $p\&\sim y$)then$P1=p$,else$P1=o$;

$MUX303c$:if($y$OR $r\&\sim z$)then$P2=r$,else$P2=q$;

$MUX303d$:if($z$OR $t$)then$P3=t$,else$P3=s$,

Where m and n are outputs of MUX 302*a*, o and p are outputs of MUX 302*b*, q and r are outputs of MUX 302*c*, s and t are outputs of MUX 302*d*, x is true when bit mask set 390*a* is the same is bit mask set 390*b*, y is true when bit mask set 390*b* is the same is bit mask set 390*c*, and z is true when bit mask set 390*c* is the same is bit mask set 390*d*.

Figure 4:
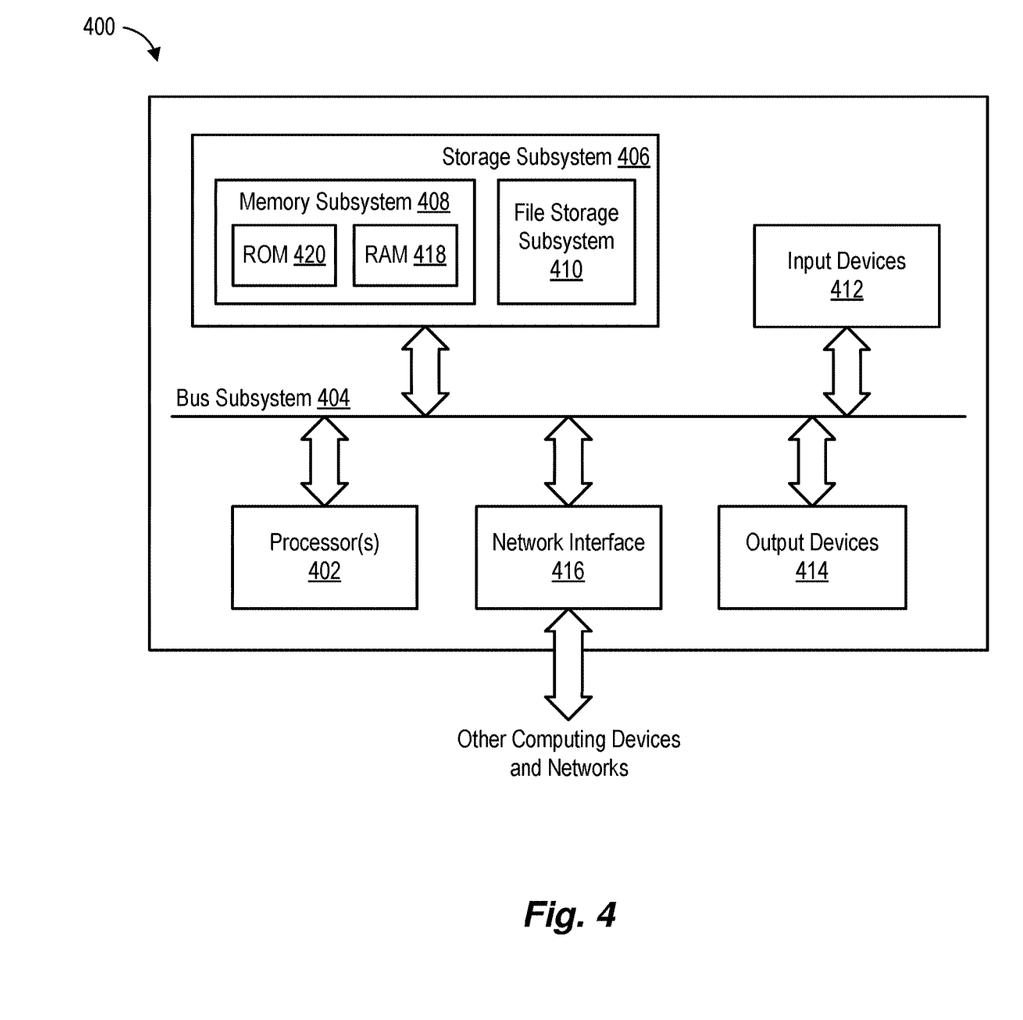
FIG. 4 illustrates a simplified block diagram of an example computer system used to execute HDL code according to various embodiments.

FIG. 4 illustrates a simplified block diagram of an example computer system used to execute hardware description language (HDL) code according to various embodiments. In some embodiments, computer system 400 executes hardware description code to generate logic circuits and/or other portions of an integrated circuit to perform the techniques described herein. A hardware description language (HDL) is a specialized computer language used to describe the structure and behavior of electronic circuits, and most commonly, digital logic circuits. HDL code may be executed on a computer system to generate digital logic circuits, including circuits described herein. FIG. 4 illustrates a simplified block diagram of an example computer system 400, which can be used to implement the techniques described in the foregoing disclosure. In some embodiments, computer system 400 may be used to generate logic circuits, switches, and other digital circuits described above, for example. As shown in FIG. 4, computer system 400 includes one or more processors 402 that communicate with a number of peripheral devices via a bus subsystem 404. These peripheral devices may include a storage subsystem 406 (e.g., comprising a memory subsystem 408 and a file storage subsystem 410) and a network interface subsystem 416. Some computer systems may further include user interface input devices 412 and/or user interface output devices 414.

Bus subsystem 404 can provide a mechanism for letting the various components and subsystems of computer system 400 communicate with each other as intended. Although bus subsystem 404 is shown schematically as a single bus, alternative embodiments of the bus subsystem can utilize multiple busses.

Network interface subsystem 416 can serve as an interface for communicating data between computer system 400 and other computer systems or networks. Embodiments of network interface subsystem 416 can include, e.g., Ethernet, a Wi-Fi and/or cellular adapter, a modem (telephone, satellite, cable, ISDN, etc.), digital subscriber line (DSL) units, and/or the like.

Storage subsystem 406 includes a memory subsystem 408 and a file/disk storage subsystem 410. Subsystems 408 and 410 as well as other memories described herein are examples of non-transitory computer-readable storage media that can store executable program code and/or data that produce circuits having the functionality of embodiments of the present disclosure.

Memory subsystem 408 includes a number of memories including a main random access memory (RAM) 418 for storage of instructions and data during program execution and a read-only memory (ROM) 420 in which fixed instructions are stored. File storage subsystem 410 can provide persistent (e.g., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 400 is illustrative and many other configurations having more or fewer components than system 400 are possible.

Further Examples

Each of the following non-limiting features in the following examples may stand on its own or may be combined in various permutations or combinations with one or more of the other features in the examples below.

In one embodiment, the present disclosure includes a circuit to compress data comprising: a first plurality of switch circuits having inputs coupled to a plurality of values of an input vector, the first plurality of switch circuits further having control inputs coupled to bits of a bit mask to selectively couple multiple values of the plurality of values on one input of each of the first plurality of switch circuits to corresponding outputs of the first plurality of switch circuits; a second plurality of switch circuits having inputs coupled to the multiple values on the outputs of the first plurality of switch circuits; and a logic circuit having inputs coupled to the outputs of the first plurality of switch circuits and having outputs coupled to select inputs of the second plurality of switch circuits, the logic circuit detecting particular values on the outputs of the first plurality of switch circuits and configuring the second plurality of switch circuits to each output one of the particular values.

In another embodiment, the present disclosure includes a method of compressing data comprising: receiving an input vector comprising a plurality of values on a plurality of inputs of a first plurality of switch circuits; selectively coupling, based on a plurality of sets of bits, multiple values of the plurality of values on the inputs of the first plurality of switch circuits to corresponding outputs of the first plurality of switch circuits; receiving the multiple values from the outputs of the first plurality of switch circuits on a plurality of inputs of a second plurality of switch circuits; and selectively coupling a portion of the multiple values to outputs of the second plurality of switch circuits, wherein the selectively coupling is based on particular values of the multiple values.

In another embodiment, the present disclosure includes a non-transitory machine-readable medium storing a hardware definition language (HDL) program executable by a computer, the program comprising sets of instructions for: receiving an input vector comprising a plurality of values on a plurality of inputs of a first plurality of switch circuits; selectively coupling, based on a plurality of sets of bits, multiple values of the plurality of values on the inputs of the first plurality of switch circuits to corresponding outputs of the first plurality of switch circuits; receiving the multiple values from the outputs of the first plurality of switch circuits on a plurality of inputs of a second plurality of switch circuits; and selectively coupling a portion of the multiple values to outputs of the second plurality of switch circuits, wherein the selectively coupling is based on particular values of the multiple values.

In one embodiment, the plurality of values comprises zero values and non-zero values, and wherein in the particular values are zero values.

In one embodiment, the bit mask comprises a plurality of subsets of bits, each subset of bits selecting one of the particular values of the plurality of values, wherein each subset of bits is coupled to a different one of the first plurality of switch circuits.

In one embodiment, the inputs of the first plurality of switch circuits are coupled to two or more values of the input vector.

In one embodiment, each input of the first plurality of switch circuits is coupled to two values of the input vector.

In one embodiment, the bits of the bit mask couple a particular plurality of values to the output of each switch circuits based on a binary tree selection.

In one embodiment, the inputs of each switch circuit of the first plurality of switch circuits are coupled to the plurality of values of the input vector, and wherein the select inputs of each switch circuit are coupled to a different portion of a total number of bits of a bit mask to couple a unique subset of plurality of values to an output of each of the first plurality of switch circuits.

In one embodiment, the first plurality of switch circuits and the second plurality of switch circuits are multiplexers.

In one embodiment, the input vector comprises two (2) to a power of N bits, wherein the bit mask comprises a plurality of N minus 1 length sets of bits.

In one embodiment, the logic circuit compares bits coupled to the control inputs of at least two switch circuits of the first plurality of switch circuits and configures a first switch circuit of the second plurality of switch circuits to output a first particular value from a first set of multiple values and configures a second switch circuit of the second plurality of switch circuits to output a second particular value from the first set of multiple values.

In one embodiment, the first plurality of switch circuits comprise a plurality of stages.

In one embodiment, the second plurality of switch circuits comprise a plurality of stages.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A circuit to compress data comprising:
   a first plurality of switch circuits having inputs coupled to a plurality of values of an input vector, the first plurality of switch circuits further having control inputs coupled to bits of a bit mask to selectively couple multiple values of the plurality of values on one input of each of the first plurality of switch circuits to corresponding outputs of the first plurality of switch circuits;
   a second plurality of switch circuits having inputs coupled to the multiple values on the outputs of the first plurality of switch circuits; and
   a logic circuit having inputs coupled to the outputs of the first plurality of switch circuits and having outputs coupled to select inputs of the second plurality of switch circuits, the logic circuit detecting particular values on the outputs of the first plurality of switch circuits and configuring the second plurality of switch circuits to each output one of the particular values.

2. The circuit of claim 1, wherein the plurality of values comprises zero values and non-zero values, and wherein in the particular values are zero values.

3. The circuit of claim 1, wherein the bit mask comprises a plurality of subsets of bits, each subset of bits selecting one of the particular values of the plurality of values, wherein each subset of bits is coupled to a different one of the first plurality of switch circuits.

4. The circuit of claim 1, wherein the inputs of the first plurality of switch circuits are coupled to two or more values of the input vector.

5. The circuit of claim 4, wherein each input of the first plurality of switch circuits is coupled to two values of the input vector.

6. The circuit of claim 1, wherein the bits of the bit mask couple a particular plurality of values to the output of each switch circuits based on a binary tree selection.

7. The circuit of claim 1, wherein the inputs of each switch circuit of the first plurality of switch circuits are coupled to the plurality of values of the input vector, and wherein the select inputs of each switch circuit are coupled to a different portion of a total number of bits of a bit mask to couple a unique subset of plurality of values to an output of each of the first plurality of switch circuits.

8. The circuit of claim 1, wherein the first plurality of switch circuits and the second plurality of switch circuits are multiplexers.

9. The circuit of claim 1, wherein the input vector comprises two (2) to a power of N bits, wherein the bit mask comprises a plurality of N minus 1 length sets of bits.

10. The circuit of claim 1, wherein the logic circuit compares bits coupled to the control inputs of at least two switch circuits of the first plurality of switch circuits and configures a first switch circuit of the second plurality of switch circuits to output a first particular value from a first set of multiple values and configures a second switch circuit of the second plurality of switch circuits to output a second particular value from the first set of multiple values.

11. The circuit of claim 1, wherein the first plurality of switch circuits comprise a plurality of stages.

12. The circuit of claim 1, wherein the second plurality of switch circuits comprise a plurality of stages.

13. A method of compressing data comprising:
    receiving an input vector comprising a plurality of values on a plurality of inputs of a first plurality of switch circuits;
    selectively coupling, based on a plurality of sets of bits, multiple values of the plurality of values on the inputs of the first plurality of switch circuits to corresponding outputs of the first plurality of switch circuits;
    receiving the multiple values from the outputs of the first plurality of switch circuits on a plurality of inputs of a second plurality of switch circuits; and
    selectively coupling a portion of the multiple values to outputs of the second plurality of switch circuits, wherein the selectively coupling is based on particular values of the multiple values.

14. The method of claim 13, wherein each set of bits specifies a position of one of said particular values in the input vector.

15. The method of claim 13, wherein the plurality of values comprises zero values and non-zero values, and wherein in the particular values are zero values.

16. The method of claim 13, wherein the bit mask comprises a plurality of subsets of bits, each subset of bits selecting one of the particular values of the plurality of values, wherein each subset of bits is coupled to a different one of the first plurality of switch circuits.

17. The method of claim 13, wherein the inputs of the first plurality of switch circuits are coupled to two or more values of the input vector.

18. The circuit of claim 17, wherein each input of the first plurality of switch circuits is coupled to two values of the input vector.

19. The method of claim 13, wherein the inputs of each switch circuit of the first plurality of switch circuits are coupled to the plurality of values of the input vector, and wherein select inputs of each switch circuit are coupled to a different portion of a total number of bits of a bit mask to couple a unique subset of plurality of values to an output of each of the first plurality of switch circuits.

20. A non-transitory machine-readable medium storing a hardware definition language (HDL) program executable by a computer, the program comprising sets of instructions for:
    receiving an input vector comprising a plurality of values on a plurality of inputs of a first plurality of switch circuits;

selectively coupling, based on a plurality of sets of bits, multiple values of the plurality of values on the inputs of the first plurality of switch circuits to corresponding outputs of the first plurality of switch circuits;
receiving the multiple values from the outputs of the first plurality of switch circuits on a plurality of inputs of a second plurality of switch circuits; and
selectively coupling a portion of the multiple values to outputs of the second plurality of switch circuits, wherein the selectively coupling is based on particular values of the multiple values.

\* \* \* \* \*